(12) United States Patent
Bailey et al.

(10) Patent No.: US 8,037,727 B2
(45) Date of Patent: Oct. 18, 2011

(54) NON-PLANAR SPUTTER TARGETS HAVING CRYSTALLOGRAPHIC ORIENTATIONS PROMOTING UNIFORM DEPOSITION

(75) Inventors: Robert S. Bailey, Grove City, OH (US); Melvin K. Holcomb, Grove City, OH (US); David B. Smathers, Columbus, OH (US); Timothy Wiemels, Powell, OH (US)

(73) Assignee: Tosoh SMD, Inc., Grove City, OH (US)

( * ) Notice: Subject to any disclaimer, the term of this patent is extended or adjusted under 35 U.S.C. 154(b) by 357 days.

(21) Appl. No.: 12/455,159

(22) Filed: May 29, 2009

(65) Prior Publication Data

US 2009/0235709 A1 Sep. 24, 2009

Related U.S. Application Data

(63) Continuation of application No. 10/526,702, filed as application No. PCT/US03/28418 on Sep. 12, 2003, now abandoned.

(60) Provisional application No. 60/410,751, filed on Sep. 13, 2002, provisional application No. 60/456,193, filed on Mar. 20, 2003, provisional application No. 60/460,867, filed on Apr. 7, 2003.

(51) Int. Cl.
*B21D 22/16* (2006.01)
*C23C 14/32* (2006.01)
*B23K 20/00* (2006.01)

(52) U.S. Cl. ........ 72/60; 72/347; 76/107.1; 204/298.12; 204/298.09

(58) Field of Classification Search ................. 72/57, 60, 72/347; 76/107.1; 204/298.12, 298.09
See application file for complete search history.

(56) References Cited

U.S. PATENT DOCUMENTS

| 4,231,507 | A | 11/1980 | Quinby |
| 5,085,068 | A | 2/1992 | Rhoades et al. |
| 5,456,815 | A | 10/1995 | Fukuyo et al. |
| 6,067,831 | A | 5/2000 | Amborn et al. |
| 6,193,854 | B1 | 2/2001 | Lai et al. |
| 6,279,425 | B1 | 8/2001 | Cicotte |

(Continued)

FOREIGN PATENT DOCUMENTS

| EP | 1236752 A2 | 9/2002 |
| JP | 04339497 | 6/1994 |
| WO | 0242513 | 5/2002 |

OTHER PUBLICATIONS

Korean Patent Application issued in corresponding Korean Patent Application No. 2005-7003486.

(Continued)

*Primary Examiner* — David Jones
(74) *Attorney, Agent, or Firm* — Wegman, Hessler & Vanderburg

(57) ABSTRACT

A non-planar sputter target having differing crystallographic orientations in portions of the sputter target surface that promote more desirable deposition and density patterns of material sputtered from the target surface onto a substrate. A closed dome end of the sputter target is comprised of a first crystallographic orientation and sidewalls of the sputter target are comprised of a crystallographic orientation different from that of the dome. The sputter target is formed, preferably by hydroforming or other metal working techniques, in the absence of annealing. The hydroforming manipulations result in the different crystallographic orientations while minimizing, or ideally omitting, the application of heat. Quick and cost effective non-planar sputter targets that are easily repeatably producable are achievable as a result.

15 Claims, 3 Drawing Sheets

U.S. PATENT DOCUMENTS

| | | | |
|---|---|---|---|
| 6,283,357 B1 | 9/2001 | Kulkarni et al. | |
| 6,419,806 B1 | 7/2002 | Holcomb et al. | |
| 6,482,302 B1 | 11/2002 | Li et al. | |
| 6,582,572 B2 | 6/2003 | McLeod | |
| 6,589,408 B1 | 7/2003 | Wang et al. | |
| 6,887,356 B2 | 5/2005 | Ford et al. | |
| 7,708,868 B2 * | 5/2010 | Smathers et al. | 72/347 |
| 7,776,166 B2 * | 8/2010 | Pigur et al. | 72/365.2 |
| 2001/0050223 A1 | 12/2001 | Gopairaja et al. | |

OTHER PUBLICATIONS

Curley, J.M., et al. Production of Poly(3-hydroxyalkanoates) Containing Aromatic Substituents by Pseudomonas oleovorans, Macromolecules, vol. 29, No. 5, Feb. 26, 1996, pp. 1762-1766, American Chemical Society.

Metals Handbook, Desk Edition, American Society for Metals, pp. 26-18 and 26-19, 1985.

* cited by examiner

NON-PLANAR SPUTTER TARGETS HAVING CRYSTALLOGRAPHIC ORIENTATIONS PROMOTING UNIFORM DEPOSITION

CROSS-REFERENCE TO RELATED APPLICATIONS

This application is a continuation of U.S. application Ser. No. 10/526,702, filed Sep. 14, 2005, which was the National Stage of International Application No. PCT/US2003/028418, filed Sep. 12, 2003, which claims the benefit of U.S. Provisional Application No. 60/410,751, filed Sep. 13, 2002; U.S. Provisional Application No. 60/456,193, filed Mar. 20, 2003; and U.S. Provisional Application No. 60/460,867, filed Apr. 7, 2003.

BACKGROUND OF THE INVENTION

1. Field of Invention

This invention relates to non-planar sputter targets having crystallographic orientations promoting uniform deposition of sputtered material onto a substrate and methods of making the same.

2. Description of Related Art

Cathodic sputtering is widely used for depositing thin layers or films of materials from sputter targets onto substrates. Basically, a cathode assembly including the sputter target is placed together with an anode in a chamber filled with an inert gas, preferably argon. A substrate is positioned in the chamber near the anode with a receiving surface oriented normal to a path between the cathode assembly and the anode. A high voltage electric field is applied across the cathode assembly and the anode causing electrons to eject from the cathode assembly and ionize the inert gas. The positively charged ions of the inert gas are then propelled against a sputtering surface of the sputter target due to the electric field. The ion bombardment against the sputtering surface of the target causes portions of the material of the sputtering surface to dislodge from the sputter target surface and deposit as a thin film or layer on the receiving surface of the substrate at an opposite end of the chamber.

Recently, non-planar sputter targets have been developed to provide improved sputtering and deposition uniformity. For example, open-ended cup-shaped hollow cathode magnetron (HCM) sputter targets have been developed, as disclosed in U.S. Pat. No. 6,419,806 of common assignment herewith, the disclosure of which is incorporated herein by reference. These cup or pot shaped targets are generally comprised of a high purity metallic material as the target surface and are typically formed from well-known metal-working operations such as hydroforming. The closed end of the cup-shaped target comprises a dome. Sidewalls extend from the dome to an open end of the target. The application of heat and other manipulations that may be used to form the cup-shaped targets often cause changes in the microstructure or crystallographic orientation of the materials comprising the sputter target surface. Such changes may adversely affect the deposition of sputtered materials onto the substrate.

A need in the art exists for methods of making sputter targets of desired crystallographic orientation and for targets made by such methods wherein the targets, upon sputtering, result in improved coating uniformity.

SUMMARY OF THE INVENTION

This invention provides a non-planar sputter target having crystallographic orientations in the sputter target surface that promote more desirable deposition and density patterns of material sputtered from the target surface onto a substrate. An exemplary embodiment of this invention more specifically provides a pot or bowl-shaped sputter target of the type shown in U.S. Pat. No. 6,419,806 and having a substantially planar end wall, or dome, at a closed end of the target. Sidewalls are connected to the dome and extend from the dome to an open end of the target. An inner surface of the dome and sidewalls form the sputter surface of the target, wherein the dome portion has a first crystallographic orientation and the sidewalls have a second crystallographic orientation different than the first.

According to one exemplary embodiment of the invention, a flat blank of a target surface material is provided and manipulated into a desired target shape by hydroforming. The flat target surface material is preferably comprised of a high purity metal selected from the group consisting of titanium, copper, tantalum and alloys thereof. The use of a single layer blank of material requires less material than prior plural layer targets have required, and requires less processing time to shape the single blank into the desired shape. Thus, a more reliable and cost-effective non-planar sputter target is produced in less time according to the invention.

Alternatively, a plurality of layers of materials may be used to form the target, provided the desired crystallographic orientations of the sputter target surface and target shape are achieved. Various embodiments of the invention provide a flat blank of backing plate material adjacent the target surface material. The adjacent layers of materials are similarly manipulated by hydroforming to achieve the desired target shape and target surface orientations. Still other embodiments of the invention may comprise interlayers between the backing plate and target surface layers. In any event, the backing plate material is preferably a malleable, low purity metal selected from the group consisting of aluminum, copper, steel, titanium and alloys thereof.

In a particularly preferred exemplary embodiment of the invention, the material comprising the target surface is tantalum. Manipulation of the target surface material, preferably by hydroforming, into a desired shape alters the crystallographic orientation of the target surface. In the case of a tantalum target surface having a pot or bowl shape, the dome portion of the target surface has a predominate {111} orientation, whereas the sidewalls have a mixture of {112}<110> and {110}<110> orientations, for example. The differing orientations in the dome and sidewalls of the target surface have been found to emit sputtered materials at different angles from the respective dome and sidewall portions of the target surface. The differing angles of emissions affect the uniformity and density of depositions of the sputtered material on the substrate.

The two-part orientation representation {hkl}<hkl>, is standard "sheet texture" notation, and has the following meaning. The first part, {hkl}, represents the miller indices of the crystallographic planes parallel with the sputter surface of the target. The second part, <hkl>, represents the indices for the crystallographic direction parallel with the material flow direction during forming. For the example of a 3D target with cylindrical sidewall geometry, a {112}<110> sidewall orientation means the following. The {112} planes are parallel with the inside surface of the cylinder and the <110> direction is parallel with the cylindrical axis. The shorthand notation "{112}/{110}" is used in this manuscript to represent a mixed {112}<110> and {110}<110> texture.

As used herein, the term "predominate", when used to describe the texture of the sputter surface of the dome or end wall of the target means that the proportion of the specific {h,k,l} orientation to the total of all crystalline orientations is at least 120/N % in various random portions of the dome sputter surface. Here, N refers to the number of orientations included in the x-ray diffraction analysis. For example, with BCC tantalum, six orientations (N=6) are measured ({110}, {200}, {211}, {310}, {222}, and {321}). The measured {200} and {222} diffraction intensities represent the {100} and {111} orientations, respectively. For tantalum, a predominate {111} texture indicates an orientation percentage greater than 20%. When the term "major" is used to describe the preferred texture of the sputter side walls of the target, this means that the proportion of combined {112} and {110} orientations to the total of all crystalline orientations is at least 200/N %, or 33%. Within this major {112}/{110} texture, the {112}<110> orientation is usually present in a slightly greater amount than the {110}<110> orientation. Measurement of all of these orientations can be made in accordance with conventional X-ray diffraction protocols such as those reported in U.S. Pat. No. 5,456,815.

After shaping by hydroforming, for example, the dome of the preferred tantalum target is comprised of predominate {111} orientations and the sidewalls are comprised of major {112}/{110} orientations. Tantalum has the BCC crystal structure for which <111> is the preferred emission direction. Thus, emissions from the dome tend to occur predominantly directly normal to the dome surface, whereas emissions from the sidewalls tend to occur at various non-normal angles from the side walls forming an annular atomic pattern across the barrel of the HCM. The sidewall emissions may occur at approximately 19.5 degree angles relative to the target surface normal due to the {112}<110> tantalum portions of the sidewall and at approximately 35.3 degree angles relative to normal due to the {110}<110> tantalum portions of the sidewall. As a result of the above-identified orientations, material sputtered from the cup-shaped target forms a more evenly distributed pattern when deposited on the substrate. The {112}/{110} texture provides sidewall emission which avoids the axial center of the HCM, giving rise to the beneficial annular atomic density pattern. Other textures can be conceived which would, achieve the same result. For example, a tantalum {100}<100> orientation would be a good candidate. For other materials of different crystal structure, such as FCC aluminum and copper, or HCP titanium, different orientations can be chosen to avoid sidewall emission intercepting the cylindrical axis of the HCM.

According to the various exemplary embodiments of the invention, the target surface material, or adjacent materials where applicable, is manipulated into a desired non-planar shape, preferably by hydroforming, or other metal working techniques. In the preferred embodiment of the invention, the desired target shape is a pot or bowl shape, although the artisan should appreciate that other shapes can be used, particularly as hydroforming is conducive to forming even complex shapes. Little or no heat is required during or after shaping material so as to minimize the recrystallization of the sputter surface into undesirable orientations. Post-shaping annealing is therefore preferably not performed.

In practice, according to a preferred method of forming a target according to the invention, a blank of material is placed over an annular platen of a hydroforming press. A tank having a bladder filled with hydraulic fluid is positioned in a housing above the blank. The bladder thus faces an upper surface of the blank. A mandrel or punch shaped to form the blank is positioned below the platen. The housing is lowered to contact the bladder with the upper surface of the blank. Thereafter, the mandrel is urged upwards through the opening in the annular platen and against a lower surface of the blank. As the mandrel continues to press upwards against the blank, the upper surface of the blank is urged against the bladder. At the same time, the pressure in the bladder increases up to as much as about 10,000 psi. Thus, as the mandrel urges the blank upwards, the pressurized bladder provides resistance until the blank is made to conform to the shape of the mandrel. Thereafter, the mandrel and bladder are retracted, and the target removed from the mandrel. No annealing is performed.

The preferred hydroforming process according to the invention takes approximately 1.5 minutes, is performed at room temperature, and is readily repeatable to form a plurality of consistently shaped targets as desired. Because the process is performed at room temperature, heat induced crystallographic orientation changes are minimized, or ideally eliminated. Significantly, because no annealing step is performed once the blank is formed into the desired shape, recrystallization or other orientation changes to the sputter surface are minimized, or ideally eliminated.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention will be described in detail with reference to the following figures, wherein.

DETAILED DESCRIPTION OF EXEMPLARY EMBODIMENTS

Figure 1:
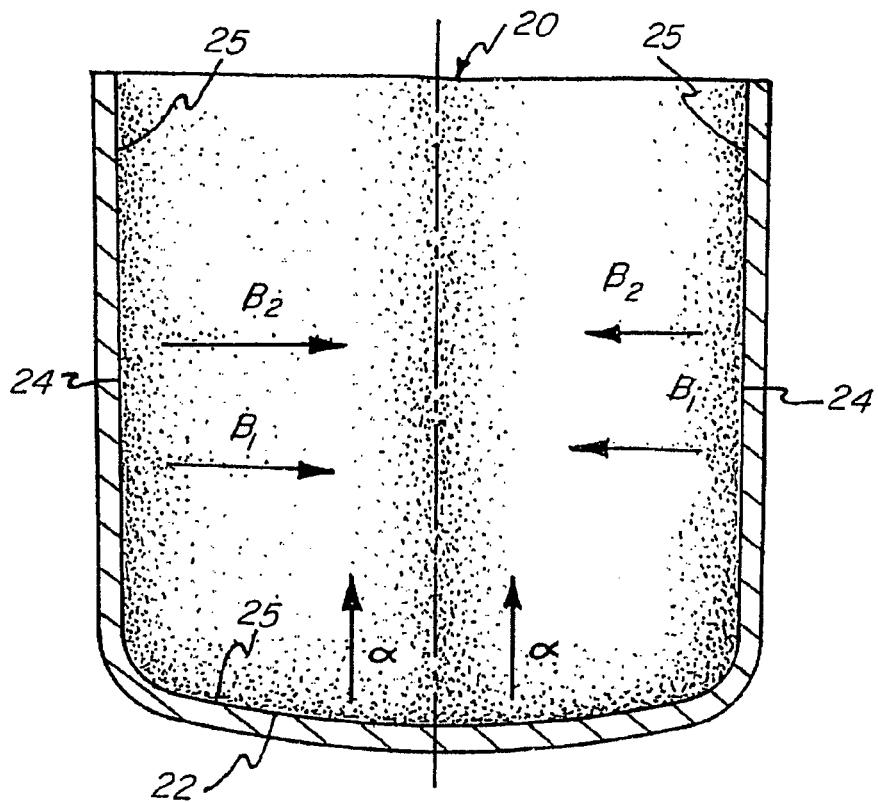
FIG. 1 illustrates an exemplary non-planar sputter target comprised of a single metallic material.
Figure 1A:
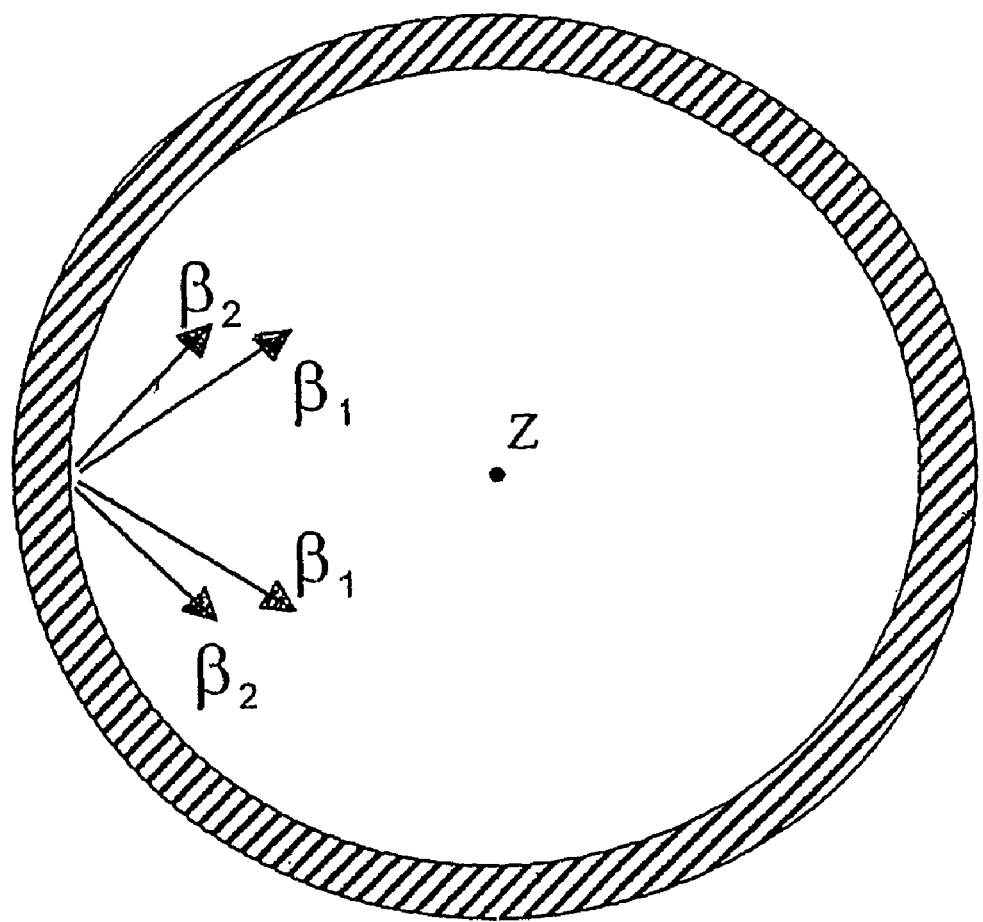
FIG. 1A illustrates a diagrammatic cross-sectional view of vector emissions from sidewalls of a target according to the invention.

FIGS. 1 and 1A illustrate an exemplary non-planar sputter target 20 according to the invention. FIG. 1, more specifically, shows a cup-shaped sputter target 20 having a substantially planar end wall, or dome 22, at a closed end of the target. Sidewalls 24 are connected to the dome 22 and extend from the dome 22 to an open end of the target. An inner surface of the dome 22 and sidewalls 24 form the sputter surface 25 of the target, wherein the dome portion has a first crystallographic orientation and the sidewalls have a second crystallographic orientation different than the first. The differing crystallographic orientations in the sputter target surface promote more desirable deposition and density patterns of material sputtered from the target surface onto a substrate, wherein material sputtered from the dome is emitted perpendicularly therefrom as shown by vector α, and material sputtered from the sidewalls are emitted non-perpendicularly from the sidewalls as shown by vectors $\beta_1$, $\beta_2$ in FIG. 1A such that the emissions form an annular pattern spaced from the central axis Z of the target. Based on preliminary observations, the cloud of atomic material for sputtering thus exists in a predominantly annular pattern with the annulus located proximate the sidewalls, spaced from the central axis of the cup.

According to one exemplary embodiment of the invention, a flat blank of a target surface material is provided having an original, unaltered crystallographic orientation and is manipulated into a desired target shape by hydroforming, for example, or other metal working techniques. The flat target surface material is preferably comprised of a high purity metal selected from the group consisting of titanium, copper, tantalum and alloys thereof. Ta is most preferred. Alternatively, a plurality of layers of materials may be used to form the target, provided the desired crystallographic orientations over portions of the sputter target surface and target shape are achieved.

Figure 2:
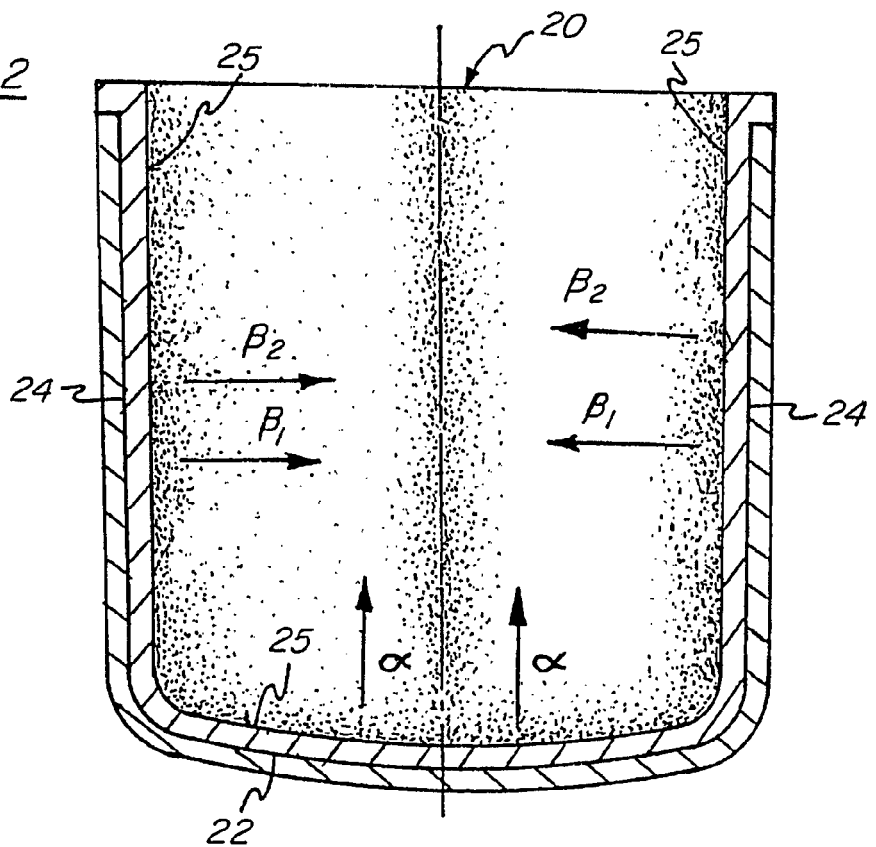
FIG. 2 illustrates an exemplary non-planar sputter target comprised of a plurality of metallic layers.

Various embodiments of the invention provide a flat blank of backing plate material adjacent the target surface material. FIG. 2 illustrates an exemplary embodiment of the sputter target according to the invention wherein at least two materials comprise the inner sputtering surface and outer shell of the target assembly. As shown in FIG. 2 using like reference numerals, the adjacent layers of materials are similarly manipulated or worked, preferably by hydroforming or other metal working techniques, to achieve the desired target shape and target surface orientations. Still other embodiments of the invention may comprise interlayers between the backing plate and target surface layers. In any event, the backing plate material is preferably a malleable, low purity metal selected from the group consisting of aluminum, copper, steel, titanium and alloys thereof.

In a particularly preferred exemplary embodiment of the invention, the flat target surface blank is comprised of tantalum. Working of the blank and the target surface material, preferably by hydroforming into a desired shape alters the crystallographic orientation of portions of the target surface. In the case of a {111}/{100} tantalum blank used to form a target surface having a pot or bowl shape in accordance with the invention, referring again to FIG. 1, the dome portion 22 of the target surface 25 tends to maintain its original predominate {111}/{100} orientations, whereas the sidewalls 24 may have a mixture of {112}/{110} orientations, for example. The proportion of the {112}/{110} orientations in the sidewalls is preferably at least 33% of the total of all crystalline orientations in the sidewall, thus constituting a major texture as defined herein.

As a result of the predominate and major orientations in the dome and sidewalls, respectively, emissions from the dome tend to occur predominantly directly normal (vector $\alpha$) to the dome surface. At the same time, emissions from the sidewalls tend to occur at approximately 19.5 degree angles (vector $\beta_1$) relative to the target surface normal at the sidewalls due to the {112}<110> tantalum portions of the sidewall, and at approximately 35.3 degree angles (vector $\beta_2$) relative to normal due to the {110}<110> tantalum portions of the sidewall.

According to the invention, the target surface material, or adjacent materials where applicable, are manipulated, using a hydroforming press, into a desired non-planar shape. In the preferred embodiment of the invention, the desired target shape is a pot or bowl shape, although the artisan should appreciate that other shapes are equally possible as hydroforming is particularly conducive to forming even complex shapes. Little or no heat is required when shaping material in a hydroforming process. As a result, planar portions (or unworked portions) of the target surface material tend to maintain their original crystallographic orientations. On the other hand, non-planar portions (or worked portions) of the target surface tend to deviate from their original crystallographic orientations. The minimization, or absence, of heat when forming the non-planar sputter targets according to the invention differs from prior art sputter targets that rely on heating at different stages of the process to achieve the desired shape or crystallographic orientations of the sputter target surface.

Figure 3:
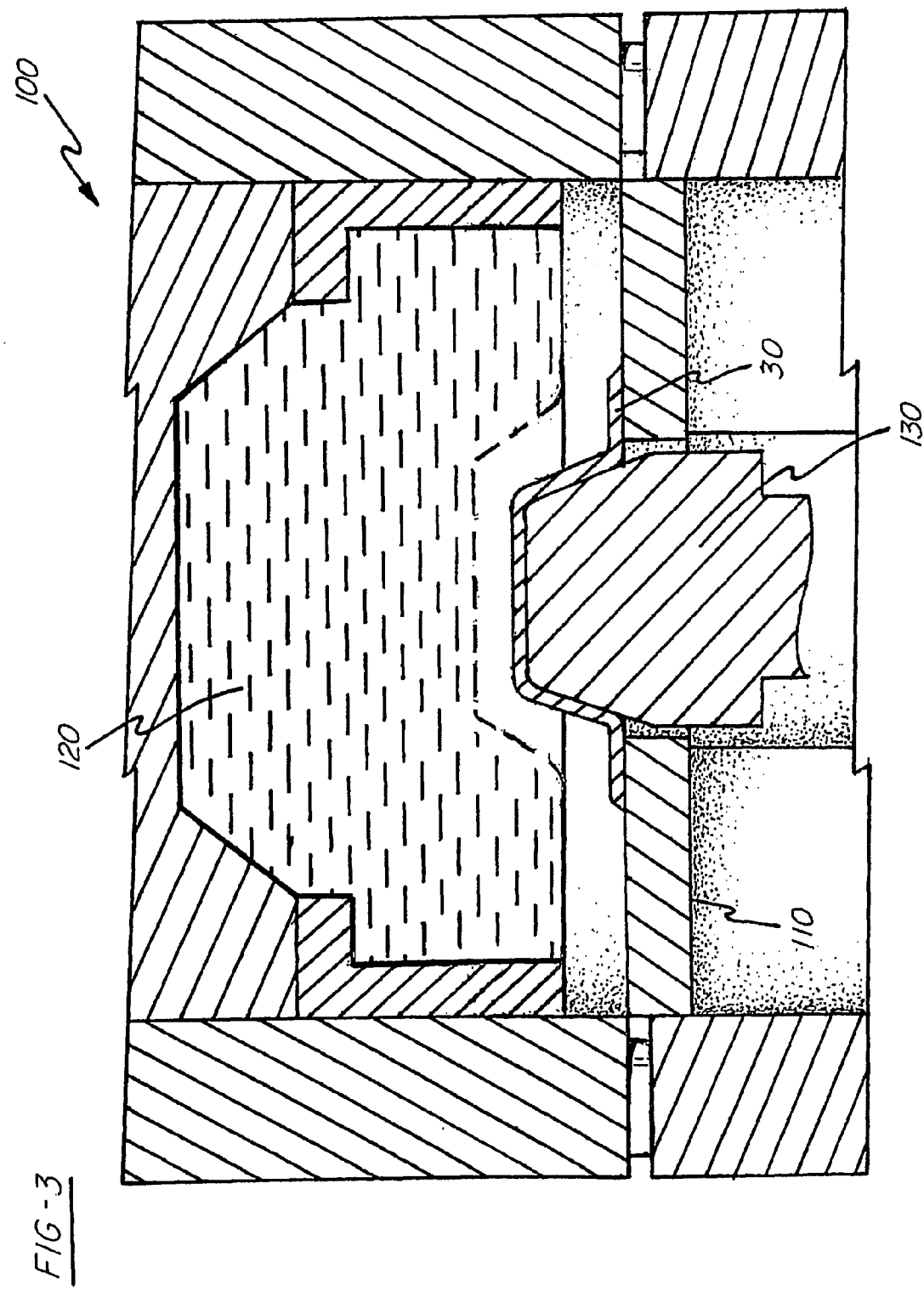
FIG. 3 illustrates a schematic diagram of a hydroforming press.

As shown in FIG. 3, a blank 30 of material is placed over an annular platen 110 of a hydroforming press 100. A bladder 120 filled with hydraulic fluid is positioned in a housing above the blank. The bladder thus faces an upper surface of the blank. A mandrel or punch 130 shaped to form the desired target contour is positioned below the platen. In practice, the housing is lowered to contact the bladder with the upper surface of the blank. Thereafter, the mandrel is urged upwards through the opening in the annular platen and against a lower surface of the blank. As the mandrel continues to press upwards against the blank, the upper surface of the blank is urged against the bladder. At the same time, the pressure in the bladder increases up to as much as about 10,000 psi. Thus, as the mandrel urges the blank upwards, the pressurized bladder provides resistance until the blank is made to conform to the shape of the mandrel. The mandrel and bladder are retracted and the target is removed from the hydroforming press, for example. Measurement of the crystallographic orientations in different sections of the sputter surface of the target may be made by X-ray diffraction.

The entire hydroforming process according to the invention takes approximately 1.5 minutes and is performed at room temperature. Because the process is performed at room temperature, heat induced crystallographic orientation changes are minimized, or ideally eliminated. Significantly, no additional annealing step is required once the blank is formed into the desired shape according to the invention. Thus, further crystallographic orientation changes are also minimized or ideally avoided. Although the mandrel shown complies with a pot or bowl-shaped sputter target, the artisan will appreciate that many other shapes may be used as well by altering the mandrel accordingly, to produce non-planar sputter targets according to the invention.

Processes for producing cup or bowl shaped targets with the desired texture can be summarized as involving several steps. The first step is to produce at starting plate with {111}{100} mixed fiber texture; more preferably with a {111} percentage greater than 20%. A recrystallized equiaxed microstructure is preferred with a grain size <100 μm. The second step is to form the plate into the bowl shape using spin-forming, hydroforming or deep drawing. This work must be done cold or at a temperature to prevent dynamic recrystallization. The amount of work needed to achieve the desired texture in the sidewall of the bowl is 35% deformation (preferably >50%). A stress relieving anneal can be included as the final step. The temperature must be low enough to prevent recrystallization and the evolution of a {111} texture component in the sidewall.

Grain Structure: The micro structure of the tantalum will have an equiax, fully recrystallized grain structure at the dome and a cold worked structure along the sidewalls. The planar blanks going into forming the NNS (near net shape) blanks are fully annealed prior to forming and not annealed post forming.

Grain Size: The average grain size will be <150 microns at the sidewall and <100 microns at the dome [ASTM E112, Table 4, Mean Intercept.]

While this invention has been described in conjunction with the exemplary embodiments described above, it is evident that many alternatives, modifications and variations will be apparent to those skilled in the art. Accordingly, the exemplary embodiments of the invention, as set forth above, are intended to be illustrative and not limiting. Various changes may be made without departing from the spirit and scope of the invention.

What is claimed is:

1. In a method of making a generally pot shaped sputter target having a first sputtering region defining a planar end wall or dome and a second sputtering region defining a sidewall connected to and extending from said first sputtering region to form an open end of said sputter target, the method of forming different crystallographic orientations in said first and second sputtering regions, the method comprising:
   a. providing a hydroforming press having a platen, a housing holding a fluid filled bladder, and a mandrel;
   b. providing a metallic blank having a given crystallographic orientation, said blank having a first area that, as a result of said forming, will define said first sputtering region of said target, said blank further having a second area that, as a result of said forming, will define said second sputtering region of said target;
   c. placing said metallic blank between said mandrel and said bladder;
   d. providing relative movement between said mandrel and said bladder to press said blank therebetween;
   e. continuing to press said blank and cold working said blank in said second area of said blank thereby deforming said second area of said blank to about 35% or greater; and
   f. releasing said blank from between said mandrel and said bladder thereby yielding a sputter target wherein said second sputtering region of said target has a crystallographic orientation that is different from said given crystallographic orientation and from the crystallographic orientation of said first sputtering region.

2. Method as recited in claim 1 wherein said bladder attains a pressure of up to about 15,000 psi during the pressing.

3. Method as recited in claim 1 wherein said pressing is conducted at room temperature.

4. Method as recited in claim 1 wherein the crystallographic orientation of said first sputtering region of said target is substantially the same as said given crystallographic orientation of said blank.

5. Method as recited in claim 4 wherein said blank is a high purity metal selected from the group consisting of titanium, copper, tantalum, and alloys thereof.

6. Method as recited in claim 5 wherein said metal is tantalum and said given crystallographic orientation of said blank is a mixed {111}/{100}.

7. Method as recited in claim 6 wherein said second sputtering region of said target has a mixed crystallographic orientation of {112}/{110}.

8. A method of forming a sputter target assembly having first and second sputtering surfaces with said first sputtering surface having a first crystallographic orientation and said second sputtering surface having a second crystallographic orientation that is different than said first crystallographic orientation, said method comprising:
   a. providing a metallic blank having said first crystallographic orientation throughout, said blank having a first area thereof that, after said forming, will define said first sputtering surface of said target, said metallic blank also having a second area that, after said forming, will define said second sputtering surface of said target;
   b. cold working said second area of said blank while pressing said blank into a desired shape, said cold working deforming said second area to about 35% or greater, to thereby form a sputter target wherein said first sputtering surface has said first crystallographic orientation and said second sputtering surface has said second crystallographic orientation.

9. Method as recited in claim 8 wherein said method is devoid of any heat treatment annealing so that said second region of said blank will not recrystallize.

10. Method as recited in claim 8 wherein said deforming is about 50% or greater.

11. Method as recited in claim 8 wherein said step of cold working said second region of said blank while pressing said blank is performed in a hydroforming apparatus operated at about room temperature.

12. Method as recited in claim 8 wherein said metallic blank is a high purity metal selected from the group consisting of titanium, copper, tantalum, and alloys thereof.

13. Method as recited in claim 12 wherein said metal is tantalum and said first crystallographic orientation of said blank is mixed {111}/{100}.

14. Method as recited in claim 13 wherein said cold working and pressing of said second area of said blank imparts a mixed crystallographic orientation of {112}/{110} to said second sputtering surface.

15. Method as recited in claim 14 wherein said sputter target has a generally pot shape and wherein said first sputtering surface of said target defines a dome and said second sputtering surface of said target defines sidewalls connected to and extending away from said dome.

* * * * *